United States Patent [19]

Mangold et al.

[11] Patent Number: 5,759,910

[45] Date of Patent: Jun. 2, 1998

[54] PROCESS FOR FABRICATING A SOLDER BUMP FOR A FLIP CHIP INTEGRATED CIRCUIT

[75] Inventors: Rick Lee Mangold; James George Lance, Jr., both of Lake Worth, Fla.

[73] Assignee: Motorola, Inc., Schaumburg, Ill.

[21] Appl. No.: 773,248

[22] Filed: Dec. 23, 1996

[51] Int. Cl.$^6$ ................................................. H01L 21/44
[52] U.S. Cl. .......................................... 438/613; 438/614
[58] Field of Search ................................. 437/183, 188, 437/189, 192, 203; 438/612, 613, 614, 615

[56] References Cited

U.S. PATENT DOCUMENTS

| | | | |
|---|---|---|---|
| 4,950,623 | 8/1990 | Dishon | 437/192 |
| 5,244,833 | 9/1993 | Gansauge et al. | 437/203 |
| 5,441,917 | 8/1995 | Rostoker et al. | 437/206 |
| 5,466,635 | 11/1995 | Lynch et al. | 437/183 |
| 5,468,655 | 11/1995 | Greer | 437/183 |
| 5,470,787 | 11/1995 | Greer | 437/183 |
| 5,503,286 | 4/1996 | Nye, III et al. | 437/183 |
| 5,586,715 | 12/1996 | Schwiebert et al. | 437/183 |

FOREIGN PATENT DOCUMENTS 3-58427  3/1991  Japan ................................. 437/183

*Primary Examiner*—Kevin Picardat
*Attorney, Agent, or Firm*—Philip P. Macnak; Eduardo Guntin

[57] ABSTRACT

A process for fabricating a solder bump having an improved geometry includes the steps of evaporatively depositing a first metallization system to form a post having a predetermined volume onto an integrated circuit having a passivation layer defining a die pad window, wherein the length of the post is greater than the width of the post, and wherein the length of the post extends beyond the die pad window over the passivation layer, and evaporatively depositing a second metallization system onto the post to form a cap also having a volume, wherein the first metallization system forming the post and the second metallization system forming the cap, when reflowed, form a eutectic solder bump.

8 Claims, 2 Drawing Sheets

SECTION 134-134

PROCESS FOR FABRICATING A SOLDER BUMP FOR A FLIP CHIP INTEGRATED CIRCUIT

FIELD OF THE INVENTION

This invention relates in general to solder interconnects for flip chip integrated circuit die, and more specifically to an improved solder bump geometry which enables a fine pitch bump configuration.

BACKGROUND OF THE INVENTION

Integrated circuit die have for a number of years been "bumped" to enable direct attachment of the integrated circuit die to a support substrate, such as a printed circuit board, and have been historically referred to as flip chip integrated circuits (ICs). Center to center spacing of the die pads of flip chip ICs have in the past been limited to around 12 mils (twelve thousandths of an inch), the size being largely dictated by the size of the flip chip bump required to make a reliable solder connection to the printed circuit board. Such center to center die pad spacing, has in the past, limited the number of input and output die pads provided on an integrated circuit to approximately 150, and at a cost of a significant amount of chip area being devoted to the input and output die pads, as will be described further below. Newer integrated circuits are being developed which have in excess of 150 of input and output die pads. However, the technology available for bumping integrated circuit die has lagged behind the need for providing tighter bump pitches for an ever increasing number of input and output die pads. What is needed is a die bumping process which will allow fine pitch bump configurations to be provided, thereby reducing the complexity and cost of flip chip integrated circuits having a large number of input and output die pads.

DESCRIPTION OF THE PREFERRED EMBODIMENTS

Figure 1:
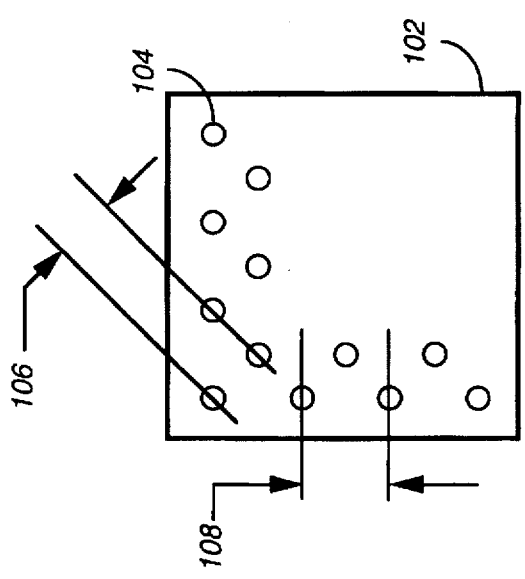
FIGS. 1 and 2 illustrate a prior art flip chip IC and the layout of a printed circuit board suitable for receiving the prior art flip chip IC, respectively.
Figure 2:
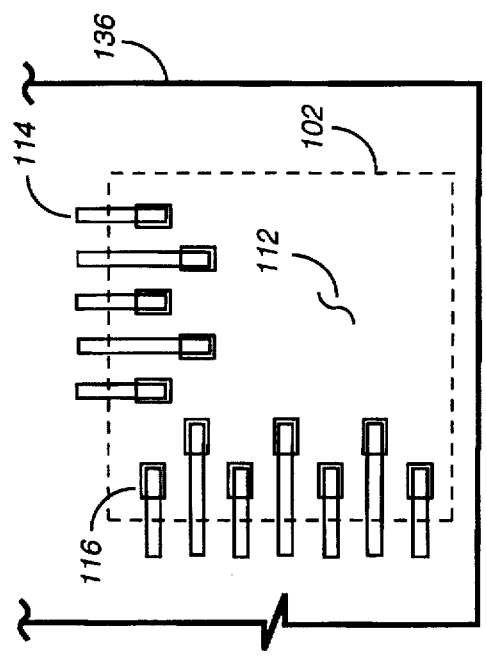

FIGS. 1 and 2 illustrate a prior art flip chip IC 102 and the layout of a printed circuit board 136 suitable for receiving the prior art flip chip IC 102, respectively. The IC 102 is shown from the circuit side and includes a number of input and output die pads 104, which by way of example are shown along two edges of the integrated circuit die and have a circular pad geometry. It will be appreciated that the die pads can be provided along all four sides of the integrated circuit die as well. As shown in FIG. 1 the die pads 104 are arranged in two rows to accommodate the number of input and output die pads required for interconnection to external circuits, with the inner die pads 104 staggered relative to the outer die pads 104 along the edges of the integrated circuit die. The minimum center-to-center die pad spacing using the prior art solder bumping techniques is 12 mils (twelve thousandths of an inch), which is defined as the minimum center-to-center spacing 106 between the inner and outer rows of die pads, and the spacing 108 between adjacent die pads 104 in the same row. As shown in FIG. 1, the spacing 108 between adjacent die pads is larger than the spacing 106 between adjacent rows to provide corner die pads which are equally spaced along the inner row of die pads.

The printed circuit board 136 to which the flip chip IC 102 is attached as shown in FIG. 2 from the circuit side of the board 136, and includes conductive runners 114 which provide connection to the flip chip IC input and output die pads and external circuitry located on the printed circuit board. The conductive runners 114 are typically covered with a solder, or isolation, mask 112 to electrically isolate the conductive runners 114. Windows 116 are placed in the solder mask 112 only at those locations where electrical connection between the flip chip IC or other components and the printed circuit board 136 occurs.

It will be appreciated that the number of rows of die pads 104 which are present on the flip chip IC is a function of the number of input and output die pads and the overall size of the integrated circuit die. Flip chip ICs having only a limited number of input and output die pads may require but a single row of die pads along each edge of the integrated circuit die, whereas a prior art flip chip ICs having 150 input and output die pads, could require as many as five rows of die pads 104 to be placed along each edge of the integrated circuit die, leading to a significant increase in the complexity and size of the integrated circuit die, which translates directly into the cost of the integrated circuit die. As previously stated above, the center to center spacing between die pads 104 which in the prior art is limited to a minimum of 12 mils.

Figure 3:
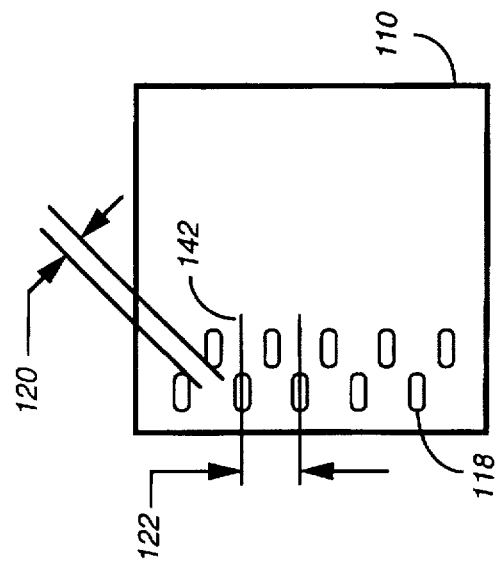
FIGS. 3 and 4 illustrate a flip chip integrated circuit having an improved bump geometry and the layout of a printed circuit board suitable for receiving the flip chip IC, respectively, in accordance with the present invention.
Figure 4:
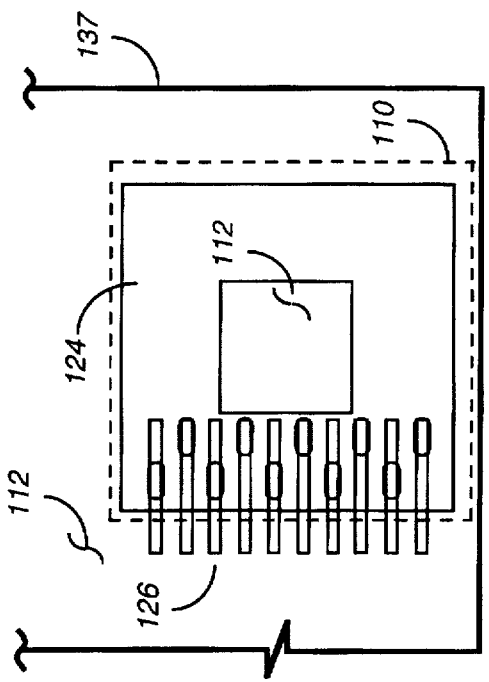

FIGS. 3 and 4 illustrate a flip chip integrated circuit 110 having an improved bump geometry and the layout of a printed circuit board 137 suitable for receiving the flip chip IC, respectively, in accordance with the present invention. The flip chip IC 110 is shown from the circuit side and by way of example includes a number of input and output die pads 118 along one edge of the integrated circuit die, having an elongated rectangular pad geometry with circular ends. It will be appreciated that an oval, or elliptical, pad geometry can be utilized as well, as will be described in detail below; and that the die pads can be provided along all four sides of the integrated circuit die. As shown in FIG. 3 the die pads 118 are also arranged in two rows for comparison with that of the prior art, with the inner die pads 118 staggered relative to the outer die pads 118 along the edge of the integrated circuit die. The minimum spacing 120 between the inner and outer rows of die pads and the spacing 122 between adjacent die pads 118 is significantly reduced as compared to the prior art, and is by way of example as low as 2 mils, which is half of that provided by the conventional solder bump technologies.

The printed circuit board 137 to which the flip chip IC 110 is being attached, is also shown in FIG. 2 from the circuit side of the board, and includes conductive runners 126 which provide connection to the flip chip IC input and output die pads and external circuitry located on the printed circuit board 137. The conductive runners 126 are typically covered with a solder, or isolation, mask 112 to electrically isolate the conductive runners 114 except in those areas where electrical connection is desired. However, the significantly reduced center to center conductive runner spacing of the present invention precludes the use of the windows 116 such as provided in the prior art. In the place of the windows 116, a solder mask free area 124 is provided in the area where the electrical interconnection between the flip chip IC 110 and the printed circuit board 137 occurs. Of special note, the conductive runner length for the inner row of die pads 118 is the same length as the runner length for the outer row of die pads 118. During the solder reflow process, the solder flow occurring between the die pads 118 along the inner row of die pads is substantially the same, albeit in opposite directions, as the solder flow occurring between the die pads 118 along the outer row of die pads, thereby reducing the complexity of layout of the printed circuit board 136, and further improves the reliability of the solder connections provided for the die pads 118 of the inner rows and outer rows by maximizing the solder interface area. The conductive runners 126 in those areas where electrical connection is to take place are typically nickel plated followed by a gold flash, although it will be appreciated that organic coatings to protect the conductive runners from oxidation can be utilized as well.

Figure 5:
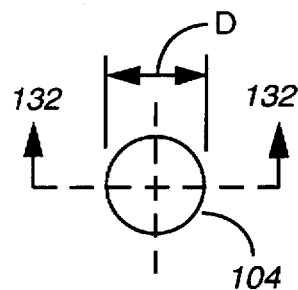
FIGS. 5 and 6 illustrate a top view and a cross-sectional view, respectively, of the prior art flip chip bump geometry.
Figure 6:
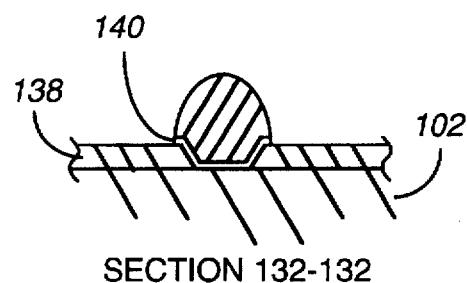

FIGS. 5 and 6 illustrate a top view and a cross-sectional view, respectively, of the prior art flip chip bump geometry. The circular die pad described in FIG. 1 is created by metallized die pad windows 140 in the passivation layer 138 of the integrated circuit die 102. In the prior art solder bumping technology, a single metallization system comprising a high lead content (90% lead-10% tin) solder ball was created by placing either tin-lead solder paste or a preformed tin-lead solder ball into the cavity formed by the die pad window 140, and then firing the integrated circuit wafer at a high enough temperature to reflow the solder paste or preformed solder ball, creating a substantially circular solder bump having a diameter D and a geometry substantially as shown in Section 132-132.

Figure 7:
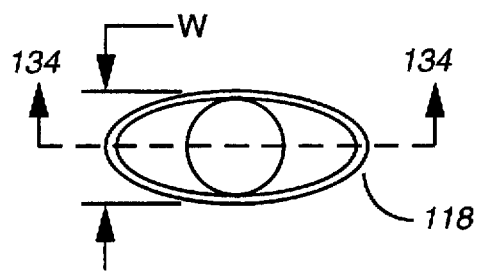
FIGS. 7 and 8 illustrate a top view and a cross-sectional view, respectively, of the improved flip chip bump geometry in accordance with the present invention.
Figure 8:
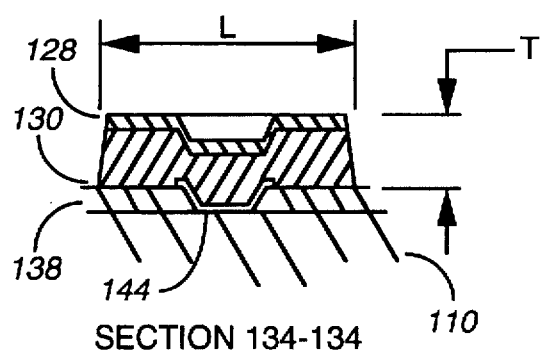

FIGS. 7 and 8 illustrate a top view and a cross-sectional view, respectively, of the improved flip chip bump geometry in accordance with the present invention. The improved solder bump geometry is rectangular with rounded ends, oval or elliptical in shape, and comprises a post 130 having a predetermined thickness T, a predetermined length L, and a predetermined width W as will be described in further detail below. The length L of the post 130 is substantially as wide as the metallized die pad window 144 defined in the passivation layer 138 of the integrated circuit die 110, and is substantially longer than the width W, so as to extend symmetrically well beyond the width of the metallized die pad window 144 onto the passivation layer 138, as shown, when different masks are used to define the die pad window metallization and the solder bump metallization. It will be appreciated that a single mask is preferable for defining both the die pad window 144 metallization and the solder bump metallization, in which instance, the die pad window metallization 144 of the present invention will extend the length of the improved solder bump geometry which is well beyond the width of the conventional metallized die pad window 140 onto the passivation layer 138. The post 130 has a major axis 142 (shown in FIG. 3) which runs substantially parallel to the length of the post 130 and normal to the edge of the integrated circuit die 110.

In the present invention, an evaporated extended eutectic solder bump is shown in Section 134-134 and is formed by evaporating a first metallization system, such as lead onto the die pad window 144 which has been prepared with a thin tin layer to improve adhesion of the lead to the die pad window metallization of the integrated circuit die 110 to form a post 130 using an evaporation mask which has openings corresponding in location and geometry to the solder bumps to be formed. After the post 130 has been deposited, a second metallization systems, such as tin is then evaporatively deposited over the post 130 to form a cap 128. No further firing of the integrated circuit wafer occurs, as in the prior art; consequently, the planarity of the solder bumps forms is far superior to that of the conventional flip chip solder bump technology. As shown in FIG. 8, the metal evaporation process results in a solder bump which tapers slightly from bottom to top and which includes a depression which corresponds substantially to the die pad window 144 in the isolation layer 138 of the integrated circuit die 110.

In the prior art, the solder bump was typically 5 mils in diameter with a center to center die pad spacing of 12 mils. A 5 mil diameter solder bump provides a cross-sectional area, or footprint, of 19.6 square mils ($\pi \times r^2$) and a volume of 34.1 cubic mils ($4/3 \pi r^3$). It will be appreciated that as the pitch between input and output die pads is reduced, there is a corresponding decrease in the die pad size which would proportionally decrease the size and eutectic tin-lead solder volume of the solder bump using the conventional flip chip solder bump technology. As an example, the reduction of the die pad spacing from 12 mils to 6 mils, as enabled by the improved solder bump geometry in accordance with the present invention, would result on a corresponding decrease in the prior art solder bump size down to 3 mils. A 3 mil diameter solder bump provides a footprint of 7.7 square mils, and a volume of eutectic tin-lead solder of 15.4 cubic mils, or in excess of a two-to-one reduction in the solder ball footprint and volume as compared to a 5 mil diameter solder bump.

The improved solder bump geometry in accordance with the present invention, while narrower than the conventional solder bump due to the finer die pad pitch, has a tin-lead eutectic solder volume at least equivalent to the conventional 5 mil solder bump due to the elongated length. By way of example, the improved solder bump geometry is 3 mils wide by 7.2 mils long, providing an approximate footprint of 19.6 square mils, the same as that of the conventional 5 mil solder bump. The thickness of the improved solder bump geometry is by way of example 3.5 mils, which results in a bump volume of approximately 68.6 cubic mils, or twice that of the conventional 5 mil solder bump. However, the actual volume of eutectic tin-lead solder formed during the solder reflow process is substantially the same as that of the conventional solder bump. As a result, when a flip chip IC is reflow soldered to a printed circuit board 137 such as described in FIG. 4 in accordance with the present invention, the tin cap 128 forms the eutectic tin-lead solder which reflows to the conductive runners 126, reliably completing the electrical connection between the flip chip IC 110 and the printed circuit board 137.

It will be appreciated that other metal deposition processes, other than as described above, can be utilized to form the improved solder bump geometry of the present invention. One other such metal deposition process is a process for manufacturing plated eutectic bumps, where a copper stud is first formed within the die pad window 144, after which eutectic lead-tin is electroplated over the copper stud forming the solder bump. As with the process described above, the plated eutectic bumps which form the improved solder bump geometry of the present invention provide reliable flip chip IC 110 interconnect to the printed circuit board 137.

While the present invention has been described in FIG. 4 as having two rows of die pads, it will be appreciated that in many instances, the present invention can reduce the number of rows required to be provided on the integrated circuit from two rows to one row, thereby significantly reducing the cost of the integrated circuit die and the complexity of the printed circuit board traces provided to interconnect to the integrated circuit die.

We claim:

1. A process for fabricating a solder bump having an improved geometry comprising the steps of:

evaporatively depositing a first metallization system to form a post having a predetermined volume onto an integrated circuit having a passivation layer defining a die pad window, wherein the length of the post is greater than the width of the post and wherein the length of the post extends beyond the die pad window over the passivation layer; and evaporatively depositing a second metallization system onto the post to form a cap also having a volume, wherein the first metallization system forming the post and the second metallization system forming the cap, when reflowed, form a eutectic solder bump.

2. The process for fabricating a solder bump according to claim 1, wherein the first metallization system forming the post is lead.

3. The process for fabricating a solder bump according to claim 1, wherein the second metallization system forming the cap is tin.

4. The process for fabricating a solder bump according to claim 1, wherein the post has a major axis extending substantially parallel to the length of the post and substantially normal to the edge of the integrated circuit die.

5. The process for fabricating a solder bump according to claim 1, wherein the predetermined volume of the post and the volume of the cap provide a volume of eutectic tin-lead solder.

6. The process for fabricating a solder bump according to claim 1, wherein the post and cap are evaporatively deposited in two substantially parallel, staggered rows of solder bumps having the improved geometry.

7. The process for fabricating a solder bump according to claim 1, wherein the length of the post extends symmetrically over the passivation layer about the die pad window.

8. The process for fabricating a solder bump according to claim 1, wherein the post is formed by plating copper, and further wherein the cap is formed by plating nickel-tin over the copper.

* * * * *